United States Patent [19]

Kinard et al.

[11] Patent Number: 5,393,351
[45] Date of Patent: Feb. 28, 1995

[54] MULTILAYER FILM MULTIJUNCTION THERMAL CONVERTERS

[75] Inventors: Joseph R. Kinard, Darnestown; De-xiang Huang, Gaithersburg; Donald B. Novotny, Bethesda, all of Md.

[73] Assignee: The United States of America as represented by the Secretary of Commerce, Washington, D.C.

[21] Appl. No.: 3,905

[22] Filed: Jan. 13, 1993

[51] Int. Cl.$^6$ ............................................. H01L 35/04
[52] U.S. Cl. ...................................... 136/225; 136/200; 136/203; 136/204; 136/205; 136/211; 136/212; 136/224; 136/230; 136/239
[58] Field of Search ................ 136/200, 203, 204, 205, 136/211, 212, 224, 225, 230, 239, 213, 214, 215, 216

[56] References Cited

U.S. PATENT DOCUMENTS

| | | | |
|---|---|---|---|
| 839,985 | 1/1907 | Briston | 136/227 |
| 1,390,743 | 9/1921 | Allcutt | 136/227 |
| 2,937,218 | 5/1960 | Sampietro | 136/4 |
| 3,607,445 | 9/1971 | Hines | 136/225 |
| 3,715,288 | 2/1973 | Riggin | 204/38 A |

(List continued on next page.)

FOREIGN PATENT DOCUMENTS

| | | | |
|---|---|---|---|
| 3707631 | 9/1988 | Germany | 136/225 |
| 58-171873 | 10/1983 | Japan | 136/225 |
| 61-53530 | 3/1986 | Japan | 136/213 |
| 64-29721 | 1/1989 | Japan | 136/200 |
| 64-64268 | 3/1989 | Japan | 136/200 |
| 1-199481 | 8/1989 | Japan | 136/200 |

OTHER PUBLICATIONS

"Thermal Conductivity and Diffusivity of a Thin Film SiO2-Si3N4 Sandwich System", F. Volklein, Electronics and Optics, Thin Solid Films 188 (1990), pp. 27-33.
"Theoretical Analysis of the AC/DC Transfer Difference of the NPL Multijunction Thermal Convertor Over the Frequency Range DC to 100 kHz", IEEE, vol. IM-21 (1972), F. J. Wilkins, pp. 130-136.
"A Proposal for a Multijunction Thermal Converter", G. Yonezaki et al., IEEE Transactions on Instrumentations and Measurement, vol. 18, No. 2 (1989), pp. 338-341.
"Accurate Radio-Frequency Microvoltages" Selby, (1953), pp. 158-164.
"Accurate Thin Film Multijunction Thermal Converter on a Silicon Chip", M. Klonz et al., IEEE, Transactions on Instrumentation and Measurement, vol. 38, No. 2 (1989), pp. 335-337.
"Monolithic Thermal Converter", P. O'Neill, p. 12.

Primary Examiner—Donald P. Walsh
Assistant Examiner—Chrisman D. Carroll
Attorney, Agent, or Firm—Lowe, Price, LeBlanc & Becker

[57] ABSTRACT

Multijunction thermal converters are formed in an integral multifilm membrane form over a through opening in a nonmagnetic, dielectric substrate. Through the use of conventional photolithographic and etching techniques, very compact, rugged and precise integrated structures are formed to include either single linear elongate heater elements, bifilar or trifilar heater elements, and multijunction thermopiles at reasonable cost. Disposition of the heater element and hot junctions of the thermopiles over a through opening in the substrate, with the cold junctions of the thermopiles disposed over the substrate thickness, enables the heating element to provide a substantially isothermal uniform heating of the thermocouple hot junctions to obtain high thermal efficiency and reduce Thompson and Peltier heating effects. Forming the essential elements into an integrated multifilm membrane also makes possible minimization of interconnections between the elements, and this results in minimized reactance. The resulting thermal converters are relatively inexpensive and rugged, have high sensitivity, superior ac-dc and RF-dc performance characteristics, and provide broader bandwidth performance than is possible with conventional devices.

24 Claims, 9 Drawing Sheets

U.S. PATENT DOCUMENTS

| | | | |
|---|---|---|---|
| 3,767,470 | 10/1973 | Hines | 136/225 |
| 3,979,226 | 9/1976 | Renner et al. | 136/208 |
| 4,111,717 | 9/1978 | Baxter | 136/225 |
| 4,211,888 | 7/1980 | Stein et al. | 136/225 |
| 4,257,822 | 3/1981 | Gomez | 136/206 |
| 4,276,441 | 6/1981 | Wilson | 136/206 |
| 4,363,927 | 12/1982 | Wilson | 136/206 |
| 4,456,919 | 6/1984 | Tomita et al. | 357/28 A |
| 4,465,895 | 8/1984 | Verner et al. | 136/225 |
| 4,558,342 | 12/1985 | Sclar | 357/30 |
| 4,571,608 | 2/1986 | Johnson | 357/28 |
| 4,665,276 | 5/1987 | Elbel et al. | 136/215 |
| 4,677,416 | 6/1987 | Nishimoto et al. | 338/35 |
| 4,850,713 | 7/1989 | Thery et al. | 374/30 |
| 4,953,387 | 9/1990 | Johnson et al. | 73/25.03 |
| 4,963,195 | 10/1990 | Kadato et al. | 136/225 |
| 4,969,956 | 11/1990 | Kreider et al. | 136/201 |
| 4,971,632 | 11/1990 | Rowe | 136/212 |
| 4,983,225 | 1/1991 | Rowe | 136/201 |
| 5,056,929 | 10/1991 | Watababe et al. | 374/181 |
| 5,059,543 | 10/1991 | Wise et al. | 437/3 |
| 5,100,479 | 3/1992 | Wise et al. | 136/225 |

MULTILAYER FILM MULTIJUNCTION THERMAL CONVERTERS

FIELD OF THE INVENTION

This invention relates to multilayer, thin-film, multijunction thermal converters (MLF-MJTC) suitable for use as primary and secondary calibration standards and for the measurement of ac and RF voltage and current over a broad frequency range. More particularly, this invention relates to MLF-MJTC's which offer performance over very broad ranges of frequency, current range and output emf, with low ac-dc and RF-dc differences, in a form suitable for low cost mass production for inclusion in a variety of instruments.

BACKGROUND OF THE PRIOR ART

Thermal converters are the most accurate instruments known for the measurement of ac voltage and current at frequencies ranging from low audio frequency on up to 1 GHz. Multijunction thermal converter structures are most conducive to a wide range of uses. These are frequently used in very high accuracy ac-dc difference metrology, because they exhibit very small ac-dc differences, provide a good square law response, and high output emfs. In one form or another, such multijunction thermal converters are employed to generate primary standards for the National Institute of Standards and Technology (NIST) for ac-dc difference, ac voltage and current, and ac power and energy calibration services.

The basic MLF-MJTC structure includes a heater element, a plurality of cooperating thermocouples connected in series, i.e., one or more thermopiles, and electrical wiring connecting the MLF-MJTC to an external circuit or known types of voltage, current and power measurement devices. In addition to the basic MLF-MJTC structure, one or more resistors connected to heater element to receive input voltage and/or current. Preferably, the thermopiles are electrically insulated from the heater element to ensure high response accuracy, i.e., so that an unknown signal will not flow into the circuit which is used to monitor the thermopiles (or even into the thermopiles themselves) as this would produce an error.

In the past, thermal converter structures have typically included fine wires of different conductive materials to form sets of thermocouples carefully located with respect to each other and the heater element. There are significant problems in physically handling the very fine wires that are combined to make such thermocouples and in soldering or otherwise affixing them to each other and to the rest of the structure. An example of such an early structure is disclosed in U.S. Pat. No. 839,985 to Bristol, titled "THERMOELECTRIC GENERATOR".

More recently, a variety of thermocouples and thermal converter structures have been designed for specific applications through the use of thin film and thick film technologies.

Regardless of which physical form is selected, i.e., whether wires or thin films deposited by any known technique are employed, the principal physical phenomenon being exploited depends on the fact that when different thermal electric materials are joined at their spaced-apart ends, with the junctions located in regions at different temperatures, the difference in the internal electron structures of the two materials causes a voltage difference to exist between the junctions. This voltage difference, which the typical thermocouple is constructed to use, is temperature-dependent and is known in the art as the "Seebeck effect". If the materials used are conductors or semiconductors, a current will flow through the thermocouple and may be extracted by connection to elements of an external circuit, typically through contact pads. When a number of thermocouples are connected in series, to enhance the rather small voltage differences generated in the individual thermocouples under certain circumstances, the plurality of thermocouples is referred to as a "thermopile". Thermopiles may be used for a variety of purposes, e.g., to determine a voltage or current, to generate electricity from sources of heat such as sunlight received by a solar collector system, or to actuate protective or sensing devices.

In light of the variety of uses to which a thermocouple or a thermopile may be employed in a device to convert energy of one form into another, e.g., heat or incident electromagnetic radiation into a current, it is important to clarify the use of the term "converter" as used in the present application. In the following description of the present invention, the term "converter" is used to refer to conversion of each of an ac and then a dc signal to heat, and in each case to generate from the heat corresponding output electrical signals which are monitored. In essence, the devices and the methods described more fully hereinbelow relate to generating electric energy from a very precisely controlled source of heat energy, this being accomplished by the provision of a very precisely formed and operated electrically-powered heater element and selectively disposed sets of thermocouples with their hot junctions heated by the heater.

Very precise standards for determining a voltage or current over a wide range of frequencies for ac-dc and RF-dc applications are necessary for an MLF-MJTC. To meet this need, an MLF-MJTC requires physical ruggedness, ability to withstand stresses associated with thermal cycling and in-use exposure to a wide range of temperatures locally, and an error-free structure, e.g., minimization of capacitances or inductances developed between the heater and thermopiles.

Such devices may be used to measure the power or calibrate the energy of radiated signals from optical sources, e.g., infrared sources or lasers. This operation relies on the physical principle that when radiation is incident on the invention a certain percentage of it is absorbed and the heater region of the invention is heated, thus producing a change in its emf output that is proportional to the incident energy. The measurement of this output can be used to determine the power or energy of the incident radiation.

Also, the measurement of vacuum, pressure or airflow can be accomplished with the present invention. This operation is permitted by the physical principle that the amount of heat lost by convection when operated at a constant power is proportional to the pressure and gas flow. The number of molecules striking the heated surface and leaving it per second is proportional to either the pressure or the flow of the gas over the surface. By measuring the temperature, which is inversely proportional to the thermal loss, which in turn is inversely proportional to either the pressure or gas flow, the pressure or gas flow can be measured. It is noted that these two properties are not measured at the same time. Consequently, pressure is measured when there is no significant gas flow and vice versa.

In order to maximize the accuracy of MLF-MJTC, it is necessary that the Thompson coefficient of the heater material be small, and the thermocouples be disposed uniformly and symmetrically on opposite sides of the elongated heater element. Low Peltier effect is also necessary for enhanced operation as exemplified by the present invention. To achieve this result the contact area between the heater and the contact pads should be on a good heat sink such as a silicon frame.

These and other related objects of this invention are described more fully hereinbelow, as are structural details of the preferred embodiments of this invention and methods of forming the same. Persons of ordinary skill in the art, upon understanding the following disclosure and the accompanying drawing figures may consider implementing obvious modifications and variations of this invention, and the claims appended hereto are intended to comprehend such variations of the explicitly disclosed embodiments.

SUMMARY OF THE INVENTION

A principal object of the present invention is to provide highly compact, inexpensive, easy to manufacture, rugged, durable, multilayer thin-film multijunction thermal converters MLF-MJTCs to measure alternating current, and voltages, at frequencies ranging from low audio frequencies to 1 GHz.

Another object of the present invention is to provide MLF-MJTCs for high accuracy ac and dc difference measurements with very low ac-dc differences and good square law responses with high output emfs, with additional thermocouples optionally provided for testing and guard functions.

Yet another object of this invention is to provide low-cost, highly reliable, mechanically stable, low and high current MLF-MJTCs, including either a single or a bifilar heater element on a composite, stress-balanced, thin-film membrane.

A related further object of this invention is to provide a method for forming the above-described type MLF-MJTC structures to provide the desired precise measurement capabilities.

These and other objects of this invention are realized by providing an MLF-MJTC having a substrate with a membrane on it. The membrane consists of a first layer of SiO2, second layer of Si3N4 and a second SiO2 layer all formed over an aperture or a through hole in the substrate. A layer of electrically resistive material is provided on a mounting surface formed of the three membrane layers. A first set of serially-connected thin-film thermocouples is formed to have their cold junctions over the substrate which serves as a heat sink and their hot junctions arrayed side by side overlying the aperture on one side of the heating element. A second plurality of serially-connected thin-film couples is formed on the opposite side of the heating element with cold junctions over the substrate and hot junctions over the aperture.

DETAILED DESCRIPTION OF THE PREFERRED EMBODIMENTS

An essential requirement of a high performance MJTC is that it should have a heater element with a small heater resistance. The heater should therefore be thin and small, and should also have a very low distributed inductance and capacitance to ensure that the ac-dc difference at high frequencies is small. The thermocouples in such an MLF-MJTC also must be formed of thin layers and must be geometrically precisely made and disposed with respect to the heater element to ensure that there is a uniform temperature distribution within the heater to ensure a small ac-dc difference. Ideally, the heater structure should be one in which the temperature of the entire heater element is uniform. Such a heater would have very low errors due to Thompson effect.

Experience in the manufacturing of semiconductor devices has led to the development of photolithographic techniques which enable the formation of extremely precise and regular geometries of thin-film elements such as the heater elements, thermocouples, resistor elements and contact pads. Such techniques, spanning both thin-film and thick-film technologies, together with a planar structure for the devices, are found to satisfy the above-stated objects of this invention.

A preferred composition of the alloy used to form the heater element, available commercially as "Evanohm", is as follows:
nickel 75%
chromium 20%
aluminum 2.5%
copper 2.5%

Suitable materials for forming thermocouples are: "Constantan" (40% Cu and 60% Ni) and "Chromel" (10% Cr and 90% Ni), and many others.

The contact pads are preferably made of a highly conductive metal, e.g., aluminum, copper, or even gold if cost and other considerations are not limiting.

The materials employed to form the thermocouples, pads, etc., are preferably applied by sputtering. Other alternatives include evaporation of the selected materials or printing with ink containing the same. Any affordable and reliable known apparatus or technique for forming uniform thin films may be utilized. The preferred structure eventually includes an integrated plurality of films, including dielectric layers formed of materials such as $SiO_2$ and $Si_3N_4$, preferably applied by a known technique such as chemical vapor deposition, organic reduction, evaporation, plasma enhanced deposition, or sputtering.

Figure 1:
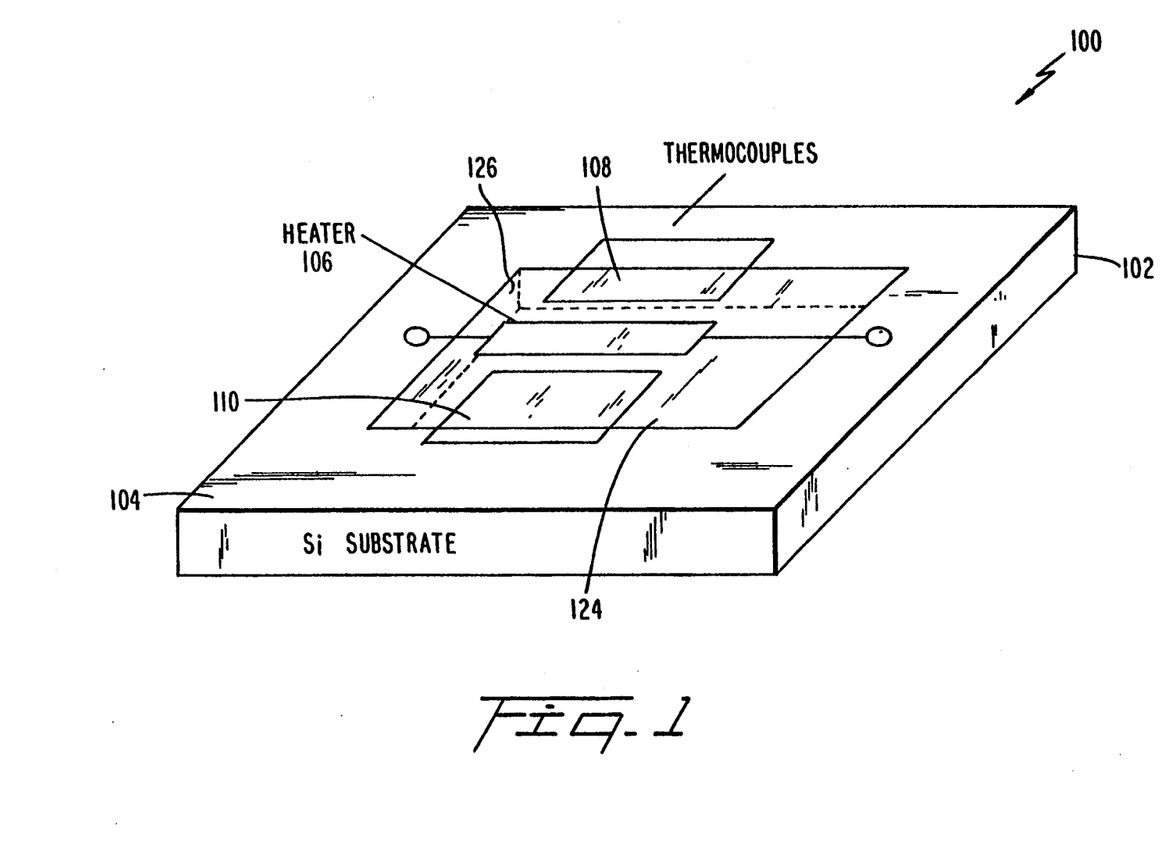
FIG. 1 is a perspective view of the multilayer film multijunction thermal converter (MLF-MJTC) of the present invention.

One of the keys to forming the high-efficiency MLF-MJTCs according to the present invention is to produce low-stress, multilayer films. One of the other keys is the formation of thin-film thermocouples. To do this, initially, a heat sink (not shown) is attached to the back of a silicon wafer 102 to keep it at close to room temperature. Selected materials for the heater element 106, the thermocouples 108,110, assorted insulation layers and the small contact pads (not shown) with low capacitance are then applied and patterned with the use of masks and photolithographic techniques.

In order to reduce the capacitance current, flowing in parallel with the heater current from the contact pads, and thereby improve the performance for accurate ac current and multirange ac voltage measurements, small pad areas ($50 \times 50$ $\mu m^2$ to $400 \times 400$ $\mu m^2$) are used. This is necessary for bifilar heater arrangements, coaxial heater arrangements and high frequency MLF-MJTC devices. However, pad size is not critical for high current type heaters have lengths from 20 $\mu m$ to 8000 $\mu m$, widths of 10 $\mu m$ to 6000 $\mu m$ and length to width ratios of 0.1 to 10. (It is noted that non-high current MLF-MJTC devices normally have lengths of 20 $\mu m$ to 8000 $\mu m$, widths of 1 $\mu m$ to 1200 $\mu m$ and length to width ratios of 4 to 800).

If sputtering is used, the sputtering rate is kept low and is adjusted as needed to ensure that the resulting structure will have low residual stresses. Other adjustable parameters in the process of applying the selected layers is the distance between the target, i.e., source of the material to be deposited, the substrate surface on which the material is to be deposited and the pressure of the ambient argon used for sputtering in this case is 1–2 mTorr. The through opening 126 is initially formed by etching the silicon substrate 102 in the area formed by this patterned $Si_3N_4$ film at the backside from its rear surface part way through the thickness thereof, with the residual thickness of silicon removed by etching only after the key elements, i.e., the heater element 106, the thermocouples 108,110, etc., are formed. This leaves a relatively stress-free, stable, strong multi-film structure stretched over the through opening.

To minimize problems that would otherwise be generated during use of the finished device at the interface between the heated material of the heater element and the silicon surface contacted thereby and regions immediately surrounding the heater, the present invention thus employs a low-stress, multifilm, composite membrane which has both a high thermal efficiency, low dielectric loss and high mechanical stability. The preferred combination of steps to form the desired structural layers will now be described. Details of the various elements which cooperate to form various embodiments of the MLF-MJTCs follow.

As generally indicated in FIG. 1, the heater element 106 is thermally isolated by its location on a thin dielectric membrane 124 which stretches across and over an opening 126 formed in silicon substrate 102. The hot junctions of each thermopile 108,110 are disposed symmetrically in close thermal proximity to heater element 106. The cold junctions of each of the thermocouples comprised within thermopiles 108,110 are, correspondingly, symmetrically disposed to be on a portion of the thin dielectric film which is an extension of the thin dielectric membrane 124 and which stretches over the silicon substrate 102 to provide good thermal contact therewith. Dielectric membrane 124 is actually a multifilm composite formed in successive steps over an initially continuous silicon substrate 102, i.e., the dielectric membrane 124 is formed or partially formed before opening 126 is created.

First, a silicon substrate 102 of suitable size and thickness is anisotropically etched from the lower or rear surface by any conventional technique so that its thickness is reduced in the region in which opening 126 is to be formed, the etching leaving a thickness of silicon in the range 10 to 100 $\mu m$. This reduced thickness portion is to provide initial support for the dielectric membrane 124 which is to be formed thereover in the course of fabricating the thermal converter structure. Then, after the thermal converter structure is completely fabricated, the remaining thickness of the silicon substrate in the region of opening 126 is entirely etched away, leaving the thermal converter as an integral part of the dielectric membrane and supported by it. This requires precise alignment of any masks used in the etching of silicon substrate 102 and/or any masks used in defining and forming the heater element, thermocouples, junctions, contact pads and the like. To facilitate proper alignment, the fabrication employs a two-sided, front-to-back alignment process, wherein suitably sized windows are patterned onto the $Si_3N_4$ film on the back side of a relatively large silicon wafer in alignment with alignment marks provided on the front side of the wafer.

For present purposes, the basic silicon wafer may be of approximately 100–600 $\mu m$ nominal thickness, polished on both sides. A silicon dioxide film is then grown on both sides thereof to a thickness in the range 100 to 700 nm nominal thickness. The term "grown" is used herein to describe a process of oxidizing the silicon wafer surface to produce a strongly adherent silicon dioxide film thereon. As the oxidation process continues, the thickness of the oxide film thus increases or "grows". Both sides of the silicon wafer are then coated with photoresist and photolithographically patterned so that the patterns on the two sides are aligned with respect to each other. The mask to be applied to the front side of the wafer provides alignment marks and the mask for the back side of the wafer provides definition for etching the openings 126 for a plurality of devices to be formed from a single silicon wafer. The alignment of the two masks is done in a conventional fixture which brings the imaged sides of both the masks together, i.e., permits visual observation of both simultaneously, and also permits controlled lateral movement of the masks relative to one another until the images are observed to be in desired alignment. The masks are then held in this chosen alignment while separated apart from each other, and a wafer provided with photo-resist coatings on both sides is inserted therebetween. The masks are then brought together and each side of the photoresist-coated silicon wafer is exposed, thereby transferring each masked image onto the wafer surface. Other methods for alignment of both sides can also be used. The images thus formed are then etched into the silicon dioxide surface, preferably with buffered hydrofluoric acid. The photoresist is then stripped in conventional manner and a nominal 100 nm to 400 nm thick silicon nitride film is deposited onto the silicon dioxide surface, preferably by a known chemical vapor deposition (CVD) process.

The nitride film used in the invention is a low stress type, chemically deposited by using a ratio of dichlorosilane-to-ammonia different from that which is normally used for film formation. An excess of about 4:1 of $DCS:NH_3$ and at a temperature of 700°–900° C. is used.

Both sides of the wafer are coated again with another layer of a photoresist, and the original back side mask is aligned to its original image which is now formed in the silicon dioxide film on the back side of the coated wafer, and the photoresist with the mask in place is again exposed. The pattern thus formed on the back side of the silicon wafer is plasma etched through the silicon nitride coating, preferably with "Freon 114" gas to form openings (i.e., windows) penetrating through both the silicon nitride and silicon oxide layers down to bare silicon. Note that the front side of the wafer is not thus etched because it is protected by the hitherto unpatterned photoresist layer. The patterned silicon nitride film at the rear surface of the wafer now serves as an etching mask to form the openings 126, which are etched through the thickness of the silicon wafer to within 10 to 100 μm of the front surface of the wafer, preferably with a 10 to 70% weight aqueous solution of potassium hydroxide held in a temperature range of 40° to 120° C.

A low temperature silicon dioxide (LTO), in a thickness of 10 to 400 nm, is then chemically vapor deposited on the front surface of the silicon wafer. The $SiO_2$—$Si_3N_4$—$SiO_2$ sequence provides lower dielectric loss than $Si_3N_4$—$SiO_2$—$Si_3N_4$, and therefore better electrical performance of the heater, and reduces the risk of surface cracks due to defects.

On the LTO thin film, a thin film in the range of 30 to 400 nm thickness of low stress "Chromel" is then sputter-deposited. The surface of the thin "Chromel" film is coated with photoresist and the first legs of the thermocouples which are to provide the thermopiles are aligned to the alignment marks patterned onto the front surface of the silicon wafer and are patterned into the resist. The photo-resist is then cured and the "Chromel" layer is etched in a perchloric acid based etchant. The photoresist is thus stripped and the surface cleaned by plasma ashing in oxygen for several minutes. The wafer is then dipped for a few seconds in diluted perchloric acid based etchant to remove any oxide film on the "Chromel" formed during the oxygen plasma cleaning, washed in deionized water, and dried. A low stress, nominally 30 to 400 nm thick constantan film is sputter deposited on the front surface over the patterned "Chromel". The "Constantan" is then etched in an aluminum etchant, the photoresist stripped and the wafer then plasma ashed for several minutes in oxygen.

A nominal 30 to 500 nm thick CVD LTO film is deposited on the front side of the silicon wafer. On this silicon oxide LTO layer, a 30 to 400 nm thick Evanohm film of low stress is sputter deposited. This Evanohm film is coated with a photoresist and the heater structure is patterned in alignment with the thermocouple hot junctions formed earlier. The Evanohm is then etched in perchloric acid based etchant. The photo-resist is then stripped, the wafer is plasma ashed for several minutes in oxygen, and another layer of 20 to 300 nm thick CVD LTO film is then deposited thereover.

The surface of the LTO film is then coated with photoresist and windows corresponding to electrical contact pads are patterned thereon and etched through the LTO layer to enable electrical contacts to be made to the thermocouples and heater elements. The photoresist is then stripped, the wafer is plasma ashed in oxygen, and a nominally 100 to 1000 nm thick layer of pure aluminum is sputter deposited thereon. The aluminum layer is then coated with another layer of photoresist, and contact pads are patterned thereon and etched with an aluminum etchant. This completes the formation of the low stress, multifilm structure of the typical MJTC. Actually, depending on the selected patterns, a multitude of the devices are thus formed on the relatively large silicon wafer.

Kerfs are cut approximately half way through the wafer thickness in the streets between individually patterned devices which are to be diced from the silicon wafer. The silicon wafer surface is then protected with hard black wax, and the remaining 10 to 100 μm thickness of the silicon substrate corresponding to the through openings in each of the devices is etched away in hot KOH. The black wax is then removed with xylene and the individual devices are separated from each other by breaking the relatively larger silicon wafer at the various kerfs.

The above-described process of making MJTCs according to this invention provides devices that have certain very valuable attributes. Thus, for example, with the generally available, high-precision masking and etching equipment now commercially available, the entire planar structure of the device can be formed with extremely regular geometry. This is important for the manufacture of primary standards, which is a principal objective of this invention. It is also very important that the temperature gradient along the heater element be very small, i.e., one would ideally like to have a heater structure with an entirely uniform temperature to reduce errors that may otherwise arise from thermoelectric effects like Thompson heating, and the like. Furthermore, the thermopiles formed in precise relationship to the heater element all present essentially a uniform thickness of the chosen metals to the elongate edges of the heater, so that there is a very uniform thermal conduction path along the entire length of the heater and between the heater and the thermopiles symmetrically disposed in correspondence therewith. This ensures a very uniform temperature distribution along the heater length and is important for forming precise standards.

The time constant for the typical MLF-MJTC according to this invention is in the range 5 to 300 msecs. This is quite fast compared to what is available in the known art. A very rapid time constant may not be desirable because, if one reduces the frequency of the ac received by the heater element, the heater temperature begins to track the variations of the ac waveform and then one no longer has an ac to dc thermal converter. It should be remembered that the heat output of a heater receiving ac has a thermal output with twice the frequency of the input ac because the polarity of the current is irrelevant in generating thermal energy. It should also be remembered that the electrical output of the thermopiles is proportional to the thermal power generated by the heater element. A thin layer of glass may be added to increase the time constant of the device to avoid tracking of the heater power peak frequency by the thermopile output, especially at low ac frequencies.

It is believed that if a high quality dielectric, e.g., glass, is used instead of silicon to provide additional thermal mass for the MLF-MJTC structures, it should be possible to increase the thermal time constant even for use of thermal converters down to low audio frequency or even a little below. If the thermal time constant can be kept short enough, e.g., in the order of 100 to 200 msec it should be possible to have high speed measurements from a device which works at low audio frequencies. No known device exists for such measurements.

Another aspect of the present invention that is particularly helpful for precise operation is the provision of guard couples at the ends of the heater element, whether the heater elements are coaxial or bifilar. Such guard couples are merely thermocouples provided at the very ends of the thermopiles to permit a user to monitor nonuniformities associated with the end portions of the heater element structures. These guard thermocouples are provided with their own contact pads to enable selective use or disuse as desired. In other words, the emf corresponding to each guard couple can be monitored separately and may selectively be added to the emf of the thermopiles. Although guard thermocouples are known in other contexts, it is believed that they have never previously been included in thin-film devices. Their optional inclusion into the MLF-MJTCs according to this invention facilitates more precise compensations to be applied to the thermopile outputs in regions where there may be relatively large thermal gradients, i.e., effects associated with the ends of the heater elements. In this manner, selective manipulation of the output from the thermopiles can be used to compensate for or make corrections for what are essentially structural limitations. When one is considering the provision of primary standards, i.e., when high accuracy is the goal, this provides a relatively secure and reliable solution to providing high quality corrections to the device output. One can either arrange for an outside circuit to utilize the outputs from the guard thermocouples or, in the alternative, one may digitize the respective data from the guard thermocouples and the principal thermopiles and then apply the necessary correction to the latter.

Basically, one uses thermal converters by applying an unknown ac and observing the output emf in the thermopiles, and then applying a known dc and bringing the output to the same level. If the ac/dc difference of the thermal converter is zero, so that its performance with ac is the same as its performance with dc, then one has succeeded in comparing the rms value of the ac to the corresponding known and precisely measured value of the dc. In other words, the thermal converter is used to precisely monitor any difference between ac and dc in the primary standard environment or in the primary calibration laboratory environment.

When used with instrumentation, thermal converters may be used to receive an input signal, e.g., an ac input, for comparison thereof with some internal reference such as a known dc reference voltage. The structures formed according to this invention enable such comparisons, with very small errors across a much broader band width than existing primary standards. Because of the thin-film structures and precise definition of the various elements in the thin films, the thermal converters according to this invention should provide very high thermal efficiency and, consequently, the need for very low power inputs. Furthermore, with a large number of thermocouples provided in each of the thermopiles, even with very low inputs it should be possible to generate signals of the order of 100 mV and, if the devices are mounted in a vacuum, the sensitivity and then output EMF will be two to ten times higher.

The mechanical strength and stability of the MLF-MJTCs is thus ensured by forming them integrated with a membrane which is a composite of silicon oxide lamella (in compressive stress), a silicon nitride lamella (in tensile stress), and another silicon oxide lamella (in compressive stress), on which the heater and thermocouple structures are fabricated. The different stresses of these lamellas are "balanced" such that the composite membrane is in a net low stress (i.e., near zero net stress) during use. The compressive stress produced by the silicon oxide lamellas on each side of the nitrate lamella are approximately equal and produce very little or no tendency to curl the membrane. Thus, if the membrane is broken somehow, it has only a slight curl-up or curl-down tendency at most.

Figure 2:
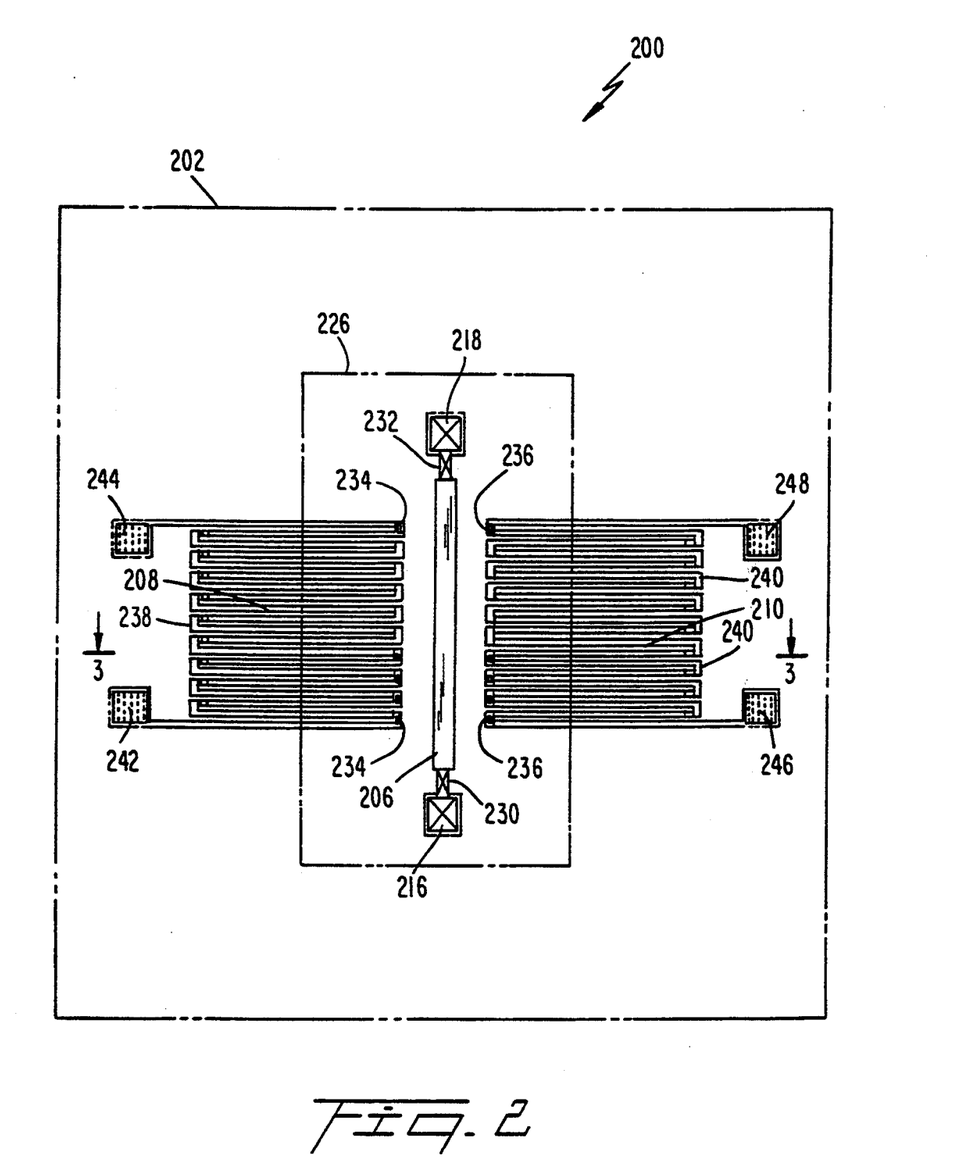
FIG. 2 is a plan view of an MLF-MJTC according to a preferred coaxial embodiment of this invention, which includes a single elongate heater element and two symmetrically disposed thermopiles with contact pads provided for electrical connections thereto.
Figure 3:
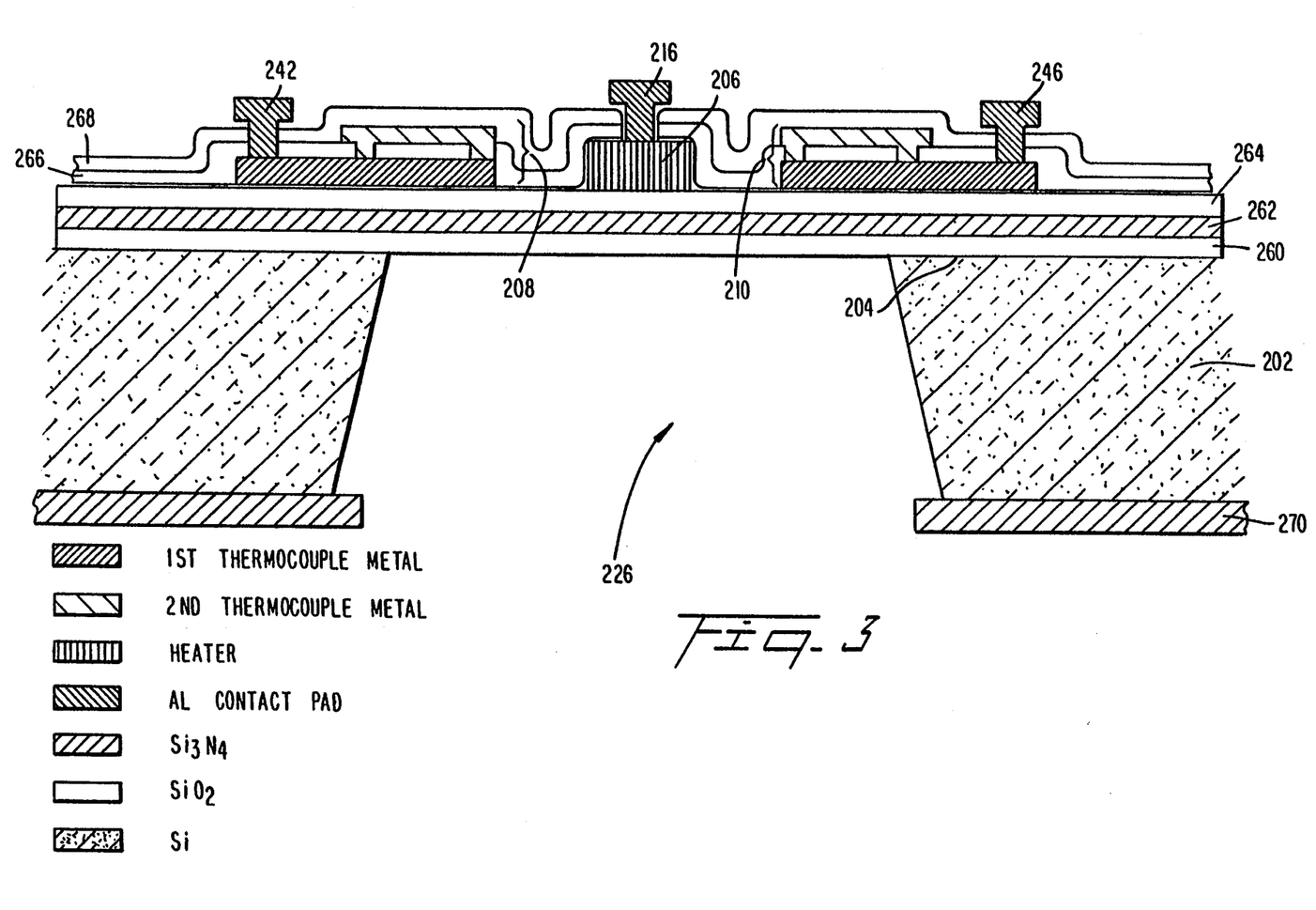
FIG. 3 is a transverse cross-sectional view, at Section III—III in the embodiment of the MJTC per FIG. 2.

FIGS. 2 and 3 respectively show plan and cross-sectional views of a first preferred embodiment of an MJTC according to this invention. In the illustrated MJTC 200, formed on an upper surface 204 of a silicon substrate 202, there is a through opening 226 over which is disposed an elongate linear flat heater element 206 connected at its ends to contact pads 216 and 218 by very short, flat, highly conductive layers 230 and 232, respectively. Symmetrically disposed on opposite sides of heater element 206 are hot junctions 234 and 236 of thermopiles 208 and 210, respectively. Note that hot junctions 234,236 are close to but physically separate and electrically insulated from heater element 206, and are located above through opening 226. Cold junctions 238 and 240, of thermopiles 208 and 210 respectively, are located over the silicon substrate 202 to be in good thermally conductive relationship therewith. Contact pads 242,244 are provided at the very ends of thermopile 208, and contact pads 246,248 are similarly provided for electrical communication with the ends of thermopile 210.

The heater element is connected in a coaxial arrangement including a connection to a signal source and a return path to that source (not shown). The return path can be located in any number of locations both on and off the semiconductor substrate. For example, a metallic casing enclosing the MLF-MJTC can be used as a return path. Return paths can also be located on other mounting structures holding the substrate, as well as on the substrate.

In FIG. 3 there is a silicon oxide layer 260 applied to the upper surface 204 of dielectric substrate 202. Substrate 202 is preferably formed of silicon but for some applications glass may be more suitable. On the silicon oxide layer 260 there is provided a silicon nitride layer 262 over which is provided a second silicon oxide layer 264. As previously noted, heater element 206 is preferably formed of a selected electrical resistance material such as "Evanohm". Each of the thermopiles 208 and 210 comprise a plurality of serially-connected and geometrically similar thermocouples formed as described earlier. The contact pads such as 216, 218 and 242–248 are all preferably formed of a highly conductive metal, e.g., aluminum or gold. Each of the thermocouples in thermopiles 208 and 210, as described earlier, comprises two dissimilar metals joined at a hot junction to be heated by heat generated in the adjacently disposed heater element 206. Adjacent thermocouples are serially connected at cold junctions 238 and 240 which are in good thermal contact through layers 260–264 with dielectric substrate 202. Additional protective silicon dioxide layers 266 and 268 may be provided (as best seen in FIG. 3).

The immediately preceding paragraphs describe an exemplary MLF-MJTC structure suitable for broadband, high-frequency, primary standards service. This device has a relatively basic and simple structure. Other, more sophisticated and somewhat more elaborate MLF-MJTCs are also encompassed by the present invention.

Figure 4:
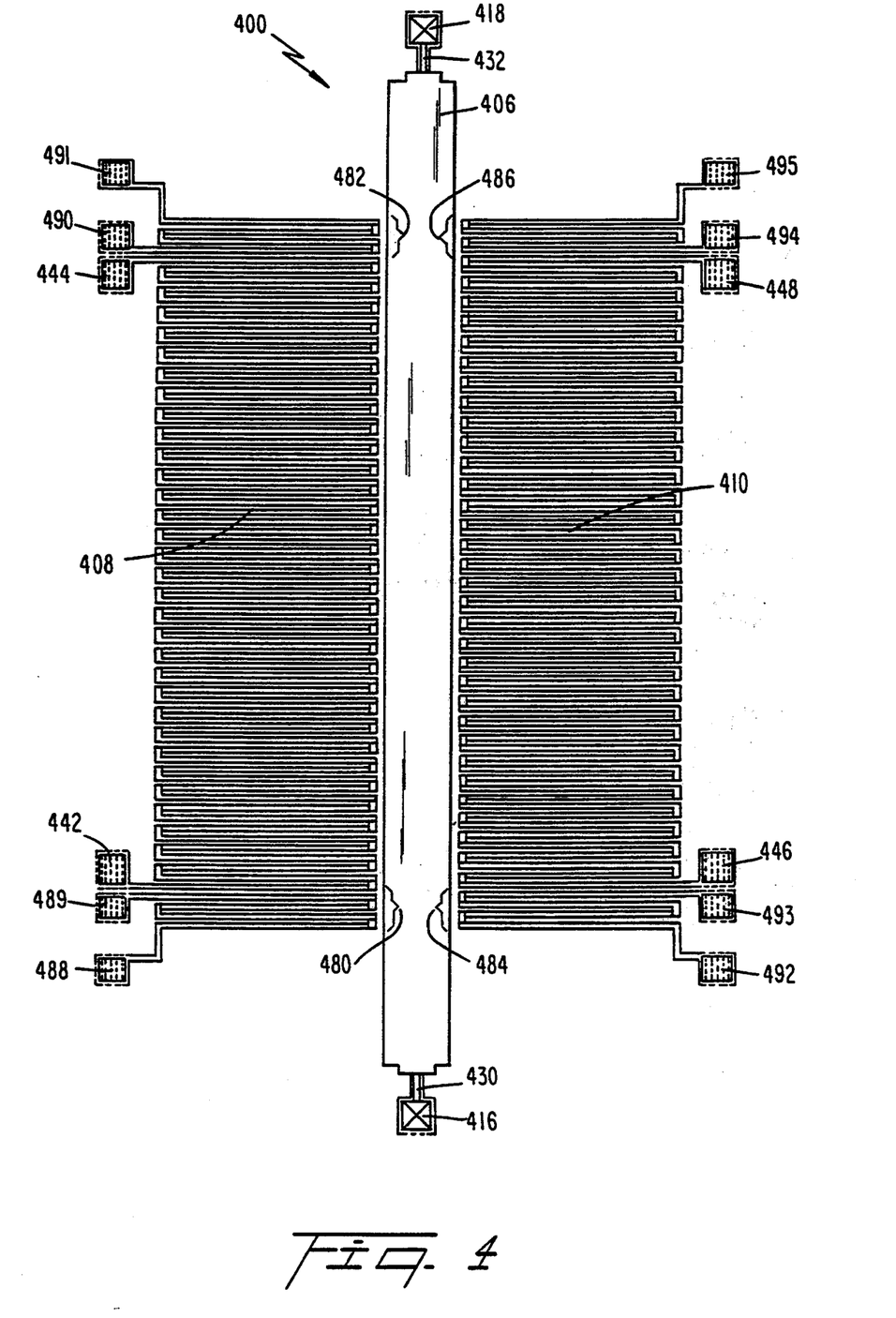
FIG. 4 is a plan view of a second coaxial embodiment which includes more numerous thermocouples disposed coaxially, i.e., symmetrically on opposite sides of the single elongate heater element with their respective hot junctions relatively close to the heater element, with guard thermocouples provided at both ends of the sets of thermocouples, with the guard thermocouples being provided with their own contact pads for selective electrical engagement therewith.

FIG. 4 is a plan view of an MLF-MJTC with a linear elongate flat heater element, two symmetrically disposed thermopiles 408 and 410, heater contact pads 416 and 418 respectively connected to heater element 406 by short flat conductors 430 and 432, and thermopile contact pads 442–448. In addition, and in a manner distinctive over the structure of the previously described embodiment per FIGS. 2 and 3, the MLF-MJTC per FIG. 4 is provided with guard thermocouples 480 and 482 for thermopile 408 as well as guard thermocouples 484 and 486 for thermopile 410. These guard thermocouples each have respective contact pads 488–495, as illustrated in FIG. 4. For simplicity, other details generally similar to those of the previously described embodiment are not illustrated. The manner in which the guard thermocouples may be utilized to enhance the precision and utility of the MLF-MJTC per FIG. 4 was described earlier.

Consideration must be given to the so-called "skin effect" which occurs when high-frequency ac flows through a conductor. It is well known that alternating current tends to flow along the outer surfaces of the conductor instead of the inner bulk thereof. This skin effect is frequency dependent, so that the effective electrical resistance is different with ac than it is with dc. Therefore, if one employs thicker heater element resistances on the MLF-MJTCs, the skin effect becomes significant. The thin-film heater structures described herein are designed to have small errors due to skin effect. This is particularly true in the low voltage ranges.

Figure 5:
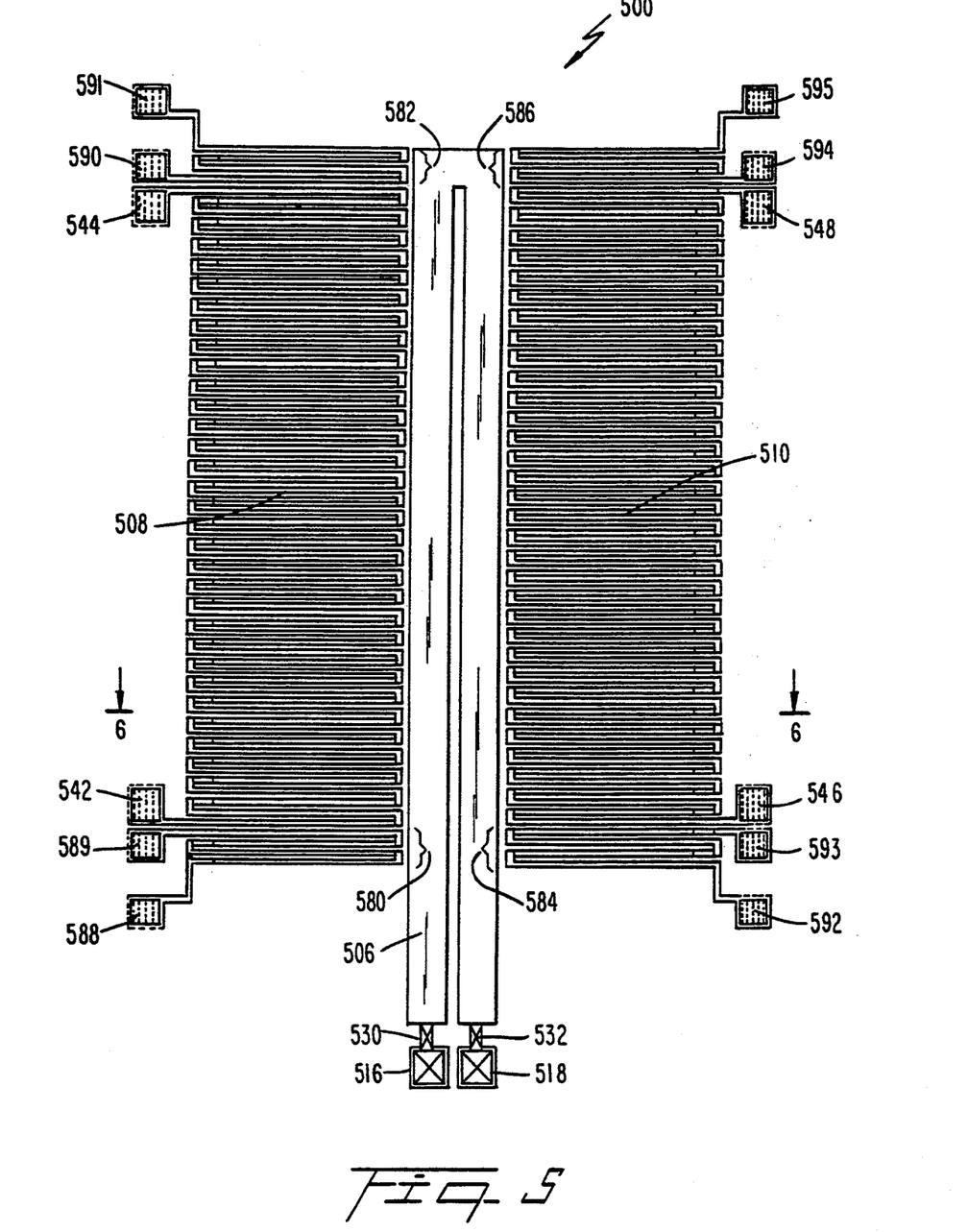
FIG. 5 is a plan view of an MLF-MJTC having a structure generally similar to that of the MLF-MJTC per FIG. 4 except for a bifilar heater element axially of two sets of symmetrically disposed thermocouples and guard couples.
Figure 6:
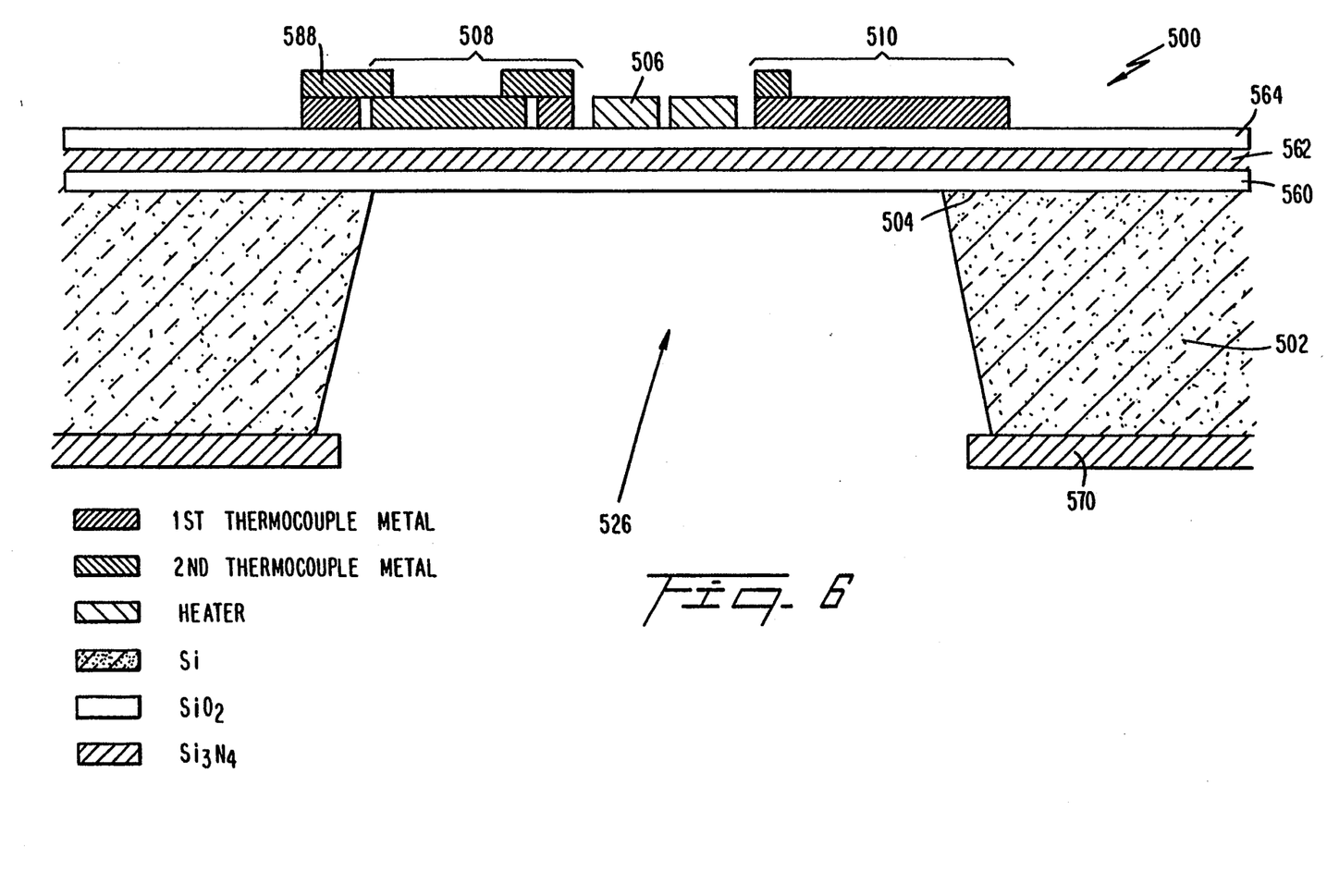
FIG. 6. is a transverse cross-sectional view at Section VI—VI in the embodiment of the MLF-MJTC per FIG. 5.

FIGS. 5 and 6 illustrate, in plan and cross-sectional views respectively, a modified MLF-MJTC 500 which has a bifilar, flat, elongate heater element 506. Note that by this form a much longer electrical resistance element is provided between heater contact pads 516 and 518 to heat the hot junctions of thermopiles 508 and 510. In other respects, the structure of MLF-MJTC 500 is generally similar to that of MLF-MJTC 400 illustrated in FIG. 4. In FIG. 6, the various layers and elements are numbered in a scheme generally comparable to that employed in FIG. 3. Persons of ordinary skill in the art should be able to interpret FIGS. 5 and 6 together in the same manner as FIGS. 2 and 3 in accordance with the corresponding description provided above.

Figure 7:
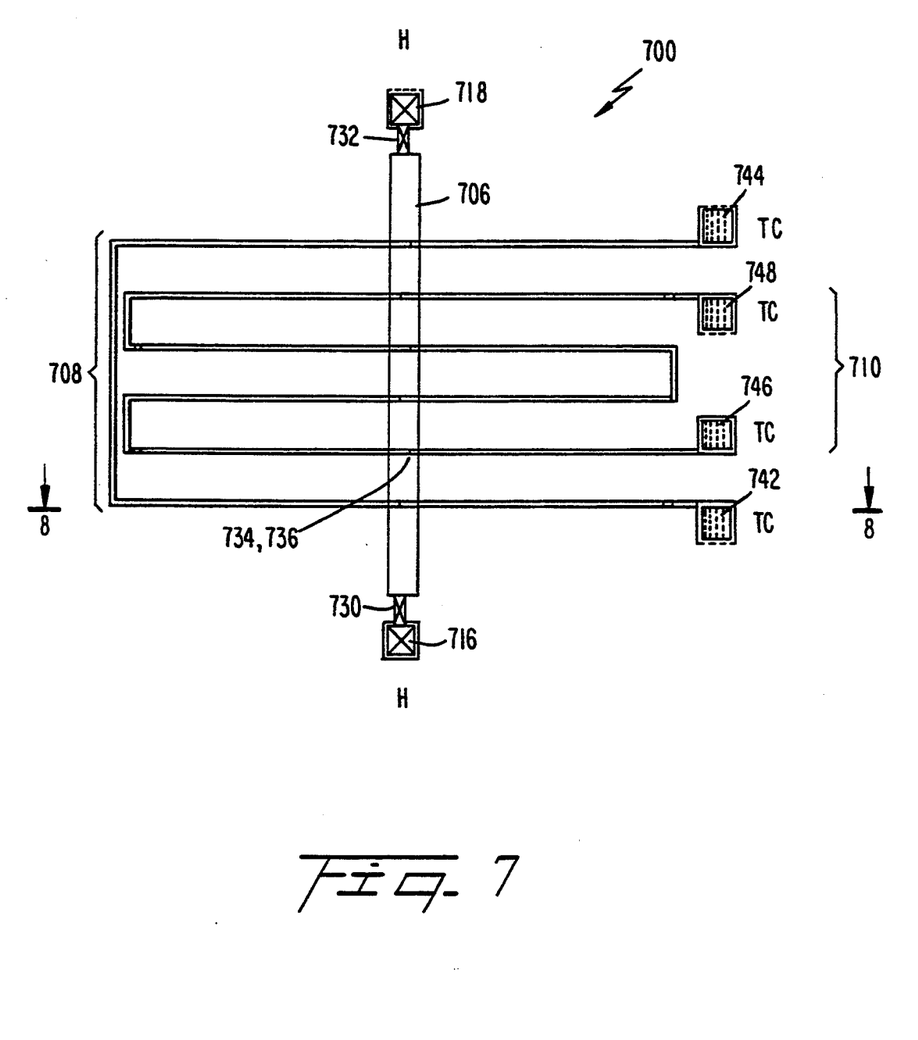
FIG. 7 is yet another embodiment according to this invention, wherein only a small number of thermocouples are incorporated within an MLF-MJTC which comprises a single elongate heater element in which the hot junctions of individual thermocouples are disposed immediately above the single heater element.
Figure 8:
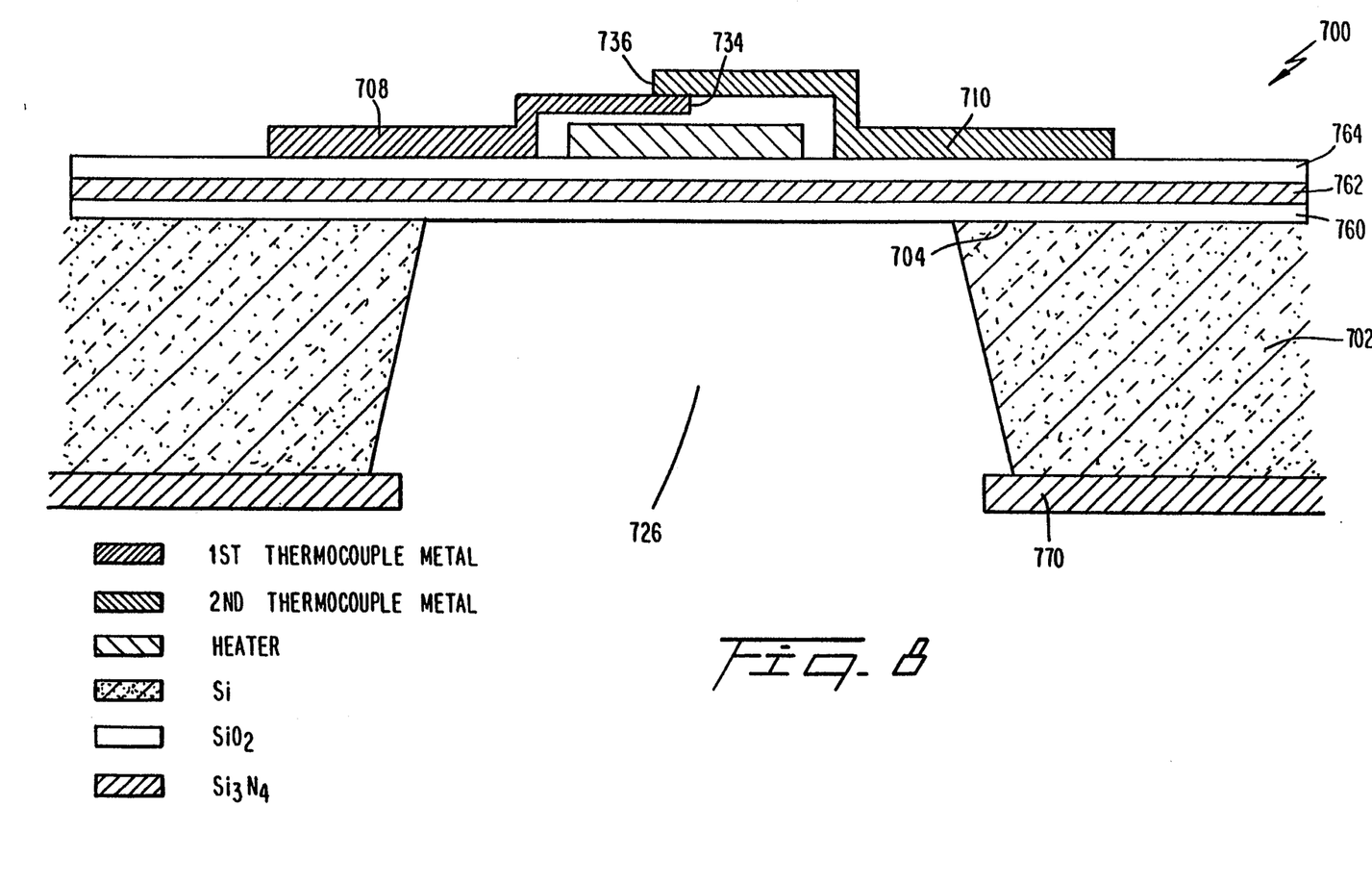
FIG. 8 is a transverse cross-sectional view at Section VIII—VIII in the embodiment of the MLF-MJTC per FIG. 7.

FIGS. 7 and 8 respectively show plan and cross-sectional views of a third embodiment of an MLF-MJTC 700 according to this invention. In this embodiment, as in the previously described embodiments, the linear elongate heater element 706 and the hot junctions of the thermocouples are all located over a through opening 726 in a dielectric substrate 702. However, MLF-MJTC 700 differs from the previously described embodiments in that there are fewer thermocouples in the thermopiles 708 and 710, and the contact pads 742, 744, 746 and 748 therefor are all disposed on the same side of heater element 706. Furthermore, the hot junctions of the thermocouples are in an overlying relationship over heater element 706, as best seen in FIG. 8. The hot thermocouples can also be arranged under heater element 706. As also seen in FIG. 8, a silicon nitride layer 770 may be provided on the back surface of dielectric substrate 702.

It is necessary to have a completely nonmagnetic mounting structure because, in the presence of magnetic materials, the skin effect errors can become noticeable in an ac frequency range from a little above 100 kHz up to 10 MHz. With respect to thermal considerations, it should be noted that the thermal efficiency of the type of multijunctions illustrated in the various figures described herein is very high, so that one can operate the MLF-MJTCs at quite low currents and low voltages compared to those possible with known types of devices. Known thermal converters cannot be operated very successfully below about 1.0 mA. If lower currents are used, one obtains a very low output emf. By contrast, with the type of multijunctions possible according to the present invention, the operation can be successfully carried out at currents much lower, and with output emfs much larger, particularly if the device is vacuum mounted. It is believed that high accuracy measurements can thus be made down to the tens of mV level because the thermal efficiency is high.

Figure 9:
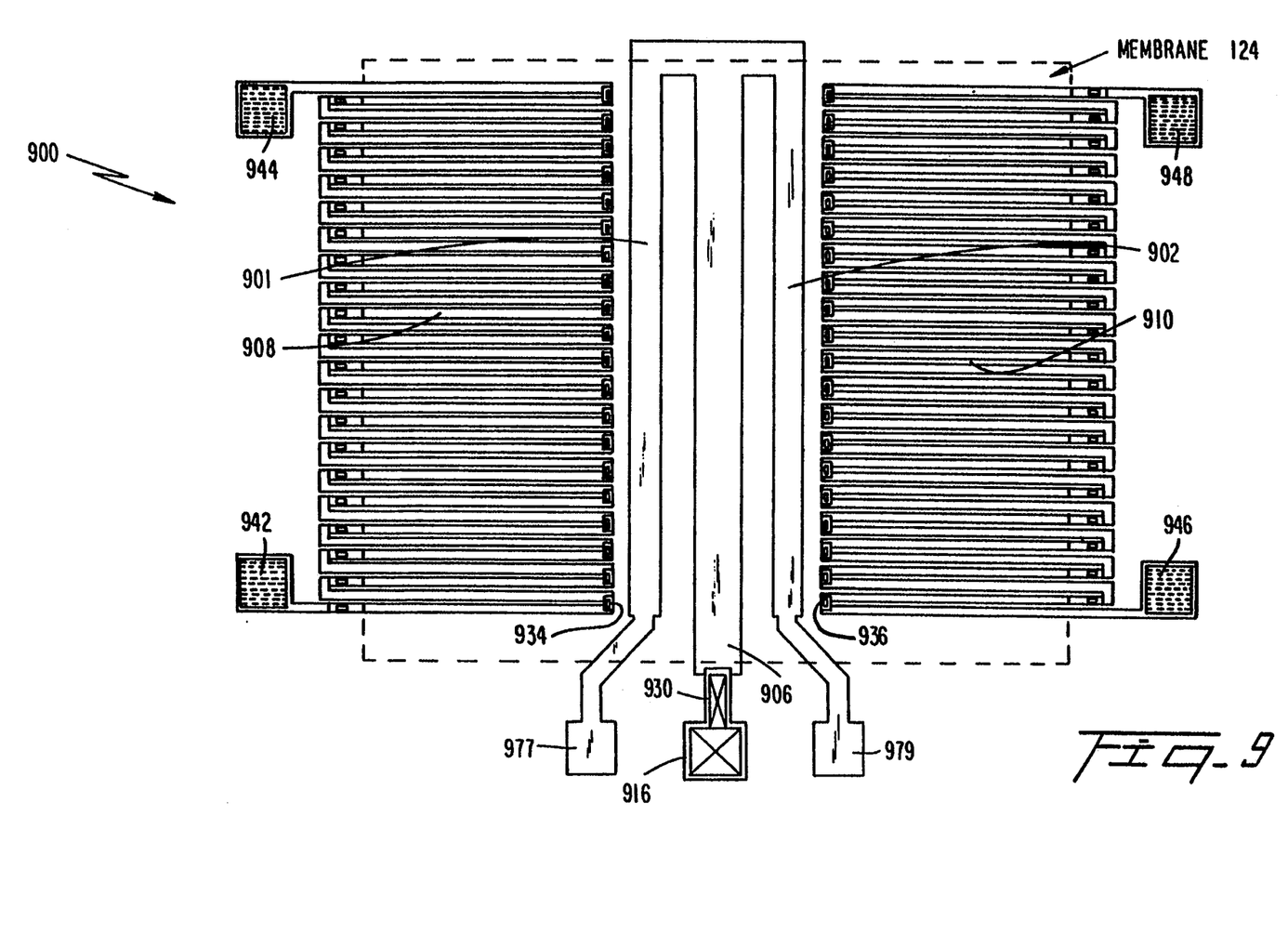
FIG. 9 is a plan view showing a trifilar heater arrangement.

FIG. 9 illustrates a "trifilar" heater arrangement. This is a structure in which an ac or dc flow through a central heater and back to the source is carried out through to on either side of the heater symmetry disposed return paths 901 and 902. The return paths can be entirely contained within the periphery of the through aperture, entirely outside the periphery or some combination of both.

With the thin-film multijunctions of the present invention one can choose heater current ratings and heater voltage ratings which are tailored to various applications more readily than is possible with the conventional devices. With conventional devices of this type, one method employed to obtain an improved isothermal region is to surround the device with a relatively large block of a highly thermally conductive material such as copper. By contrast, with the use of a nonmagnetic, thermally conductive ceramic mounting substrate to hold the MLF-MJTC substrate, the device according to the present invention is less bulky, as well as more efficient and rugged. Further improvement in thermal characteristics is provided by the use of a ceramic lid fitted to the mounting substrate enclosing the entire MLF-MJTC.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A multilayer thin-film multijunction thermal converter, comprising:
   a substrate formed of a predetermined thickness of a dielectric material, having a front surface and a rear surface with a through aperture of predetermined shape and size formed therebetween;
   a first layer of $SiO_2$, formed on the front surface of the substrate to extend over the through aperture in the substrate;
   a first layer of $Si_3N_4$, formed on the first layer of $SiO_2$, to also extend over the through aperture in the substrate;
   a second layer of $SiO_2$, formed on the first layer of $Si_3N_4$ so as to also extend over the through aperture in the substrate and to provide a mounting surface;
   a layer of an electrically resistive material provided on the mounting surface to form a thin elongate heater element having two longitudinal parallel sides and first and second ends, the heater element being shaped and sized to be entirely contained within a periphery of the through aperture in the substrate as defined at the front surface of the substrate in the lateral direction and to extend beyond the periphery of this aperture in the longitudinal direction;
   a plurality of first serially-connected thin-film thermocouples, formed and disposed to have their respective cold junctions over the substrate and outside of said periphery of the through aperture and their respective hot junctions overlying the through aperture;
   a plurality of serially-connected second thin-film thermocouples, formed and disposed to have their respective cold junctions over the substrate and outside of the periphery of the through aperture on an opposite side thereof with respect to the hot junctions of the first thermocouples, with the respective hot junctions of the second thermocouples overlying the through aperture;
   first electrical pads respectively connected to the first and second ends of the heater element and to said return path to enable provision of a controlled electrical current to the heater element; and
   second electrical pads connected to extreme ends of each of said pluralities of first and second serially-connected thin-film thermocouples to enable electrical connection thereof to an external circuit;
   wherein said first electrical pads have an area of $50 \times 50$ $\mu m^2$ to $400 \times 400$ $\mu m^2$.

2. The multilayer thin-film multijunction thermal converter according to claim 1 wherein Thompson effect is reduced by a uniform disposition of said first and second serially-connected thin-film thermocouples and said heater element.

3. The multilayer thin-film multijunction thermal converter according to claim 2, wherein said first layer of $SiO_2$ is formed in compressive stress, said first layer of $Si_3N_4$ is formed in tensile stress and said second layer of $SiO_2$ is formed in compressive stress so that said stresses are balanced to result in a net stress close to zero.

4. The multilayer thin-film multijunction thermal converter according to claim 2, wherein said pluralities of first and second serially-connected thermocouples are symmetrically disposed on either side of said heater element, said pluralities of first and second thermocouples being formed of a metal selected from a group including "Constantan" and "Chromel".

5. The multilayer thin-film multijunction thermal converter according to claim 3, further comprising a ceramic holder for said substrate, and wiring between said heater, cold junctions of said first and second thin-film thermocouples and external devices.

6. The multilayer thin-film multijunction thermal converter according to claim 3, further comprising:
   a second layer of $Si_3N_4$ formed on the rear surface of the substrate so as to entirely surround a periphery of the through aperture at the rear surface of the substrate.

7. The multilevel thin-film multijunction thermal converter according to claim 3, further comprising a return path connected to said first and second ends of said heater.

8. The multilayer thin-film multijunction thermal converter according to claim 7, wherein said return path is outside said periphery of the through aperture.

9. The multilayer thin-film multijunction thermal converter according to claim 7, further comprising:
   first electrical pads respectively connected to the first and second ends of the heater element and to said return path to enable provision of a controlled electrical current to the heater element; and
   second electrical pads connected to extreme ends of each of said pluralities of first and second serially-connected thin-film thermocouples to enable electrical connection thereof to an external circuit;
   wherein said heater element has a length from 20 $\mu m$ to 8000 $\mu m$, a width from 10 $\mu m$ to 6000 $\mu m$ and a length to width ratio of 0.1 to 10.

10. The multilayer thin-film multijunction thermal converter according to claim 5, further comprising:
    a ceramic lid arranged over said first and second pluralities of serially-connected thin-film thermocouples, said heater element, said wiring and said ceramic holder.

11. The multilayer thin-film multijunction thermal converter according to claim 1, further comprising guard thermocouples arranged on both sides of and in alignment with said pluralities of said first and second serially-connected thermocouples, said guard thermocouples having electrical pads separate from those of said pluralities of said first and second serially-connected thermocouples.

12. The multilayer thin-film multijunction thermal converter according to claim 3, wherein said heater element comprises two longitudinally arranged resistive elements connected together at a first end and connected to separate electrical pads at a second end forming a bifilar structure.

13. The multilayer thin-film multijunction thermal converter according to claim 3, wherein the material of said substrate is selected from a group including ceramic, silicon, silicon dioxide, silicon nitrate, polymide and similar materials.

14. The multilayer thin-film multijunction thermal converter according to claim 3, wherein said pluralities of said first and second serially-connected thermocouples and heater element are arranged to have a cumulative thermal time constant between 5 msec. and 300 msec.

15. The multilayer thin-film multijunction thermal converter according to claim 3, wherein an output of 10–200 mv is obtained at said electrical pads connected to said pluralities of said first and second serially-connected thermocouples.

16. The multilayer thin-film multijunction thermal converter according to claim 6, further comprising at least one additional layer of $SiO_2$ formed over said pluralities of said first and second serially-connected thermocouples and said heater element.

17. The multilayer thin-film multijunction thermal converter according to claim 7, wherein said return path is inside said periphery of the through aperture.

18. The multilayer thin-film multijunction thermal converter according to claim 3, further comprising two symmetrically disposed current return paths connected to said heater element between said pluralities of said first and second serially-connected thermocouples and located inside the periphery of the through aperture.

19. The multilayer thin-film multijunction thermal converter according to claim 3, wherein said first layer of $SiO_2$ has a thickness of 20–700 nm, said layer of $Si_3N_4$ has a thickness of 20–700 nm, and said second layer of $SiO_2$ has a thickness of 20–700 nm.

20. The multilayer thin-film multijunction thermal converter according to claim 3, wherein said heater element is selected from a group including Evanohm, nickel-chromium alloys and their equivalents with respect to Thompson effect and temperature coefficient of resistance.

21. The multilayer thin-film multijunction thermal converter according to claim 3, wherein
said plurality of first serially-connected thin-film thermocouples are formed and disposed to have their respective hot junctions arrayed overlying the heater element; and
said plurality of serially-connected second thin-film thermocouples are formed and disposed to have their respective hot junctions overlying corresponding hot junctions of the first thermocouples over the heater element.

22. The multilayer thin-film multijunction thermal converter according to claim 1, wherein said second electrical pads connected to said pluralities of said first and second serially-connected thermocouples are arranged on a single side of said heater element.

23. The multilayer thin-film multijunction thermal converter according to claim 3, further comprising two symmetrically disposed current return paths connected to said heater element and located outside said pluralities of said first and second serially-connected thermocouples.

24. The multilayer thin-film multijunction thermal converter according to claim 16 further comprising at least one opening in said additional $SiO_2$ layer above said heater element and said first and second serially-connected thermocouples.

* * * * *